United States Patent [19]

Kisakibaru et al.

[11] Patent Number: 5,431,769
[45] Date of Patent: Jul. 11, 1995

[54] METHOD AND SYSTEM FOR PLASMA TREATMENT

[75] Inventors: Toshiro Kisakibaru, Tokyo; Akira Kojima, Kanagawa; Takayuki Fukunaga, Tokyo; Yoshinori Hata, Kanagawa; Yasushi Kato, Kanagawa; Isao Honbori, Kanagawa; Tomohide Jozaki, Kanagawa; Hirohisa Kooriyama, Kanagawa, all of Japan

[73] Assignee: Sony Corporation, Tokyo, Japan

[21] Appl. No.: 140,455

[22] Filed: Oct. 25, 1993

[30] Foreign Application Priority Data

Oct. 31, 1992 [JP] Japan ............................ 4-316075
Feb. 28, 1993 [JP] Japan ............................ 5-062984

[51] Int. Cl.6 .......................................... H05H 1/00
[52] U.S. Cl. ............................ 156/345; 204/298.37; 204/298.38; 118/723 E; 118/723 MA; 216/67
[58] Field of Search ............ 156/345, 643; 134/1; 204/298.37, 298.38, 298.16; 118/723 MR, 723 MA, 723 E, 724; 315/111.21, 111.41

[56] References Cited

U.S. PATENT DOCUMENTS

| | | |
|---|---|---|
| 3,615,956 | 10/1971 | Irving et al. ............... 156/643 |
| 4,740,268 | 4/1988 | Bukhman .................... 156/643 |
| 4,747,368 | 5/1988 | Brien et al. ............... 118/724 X |
| 4,919,783 | 4/1990 | Asamaki et al. ............ 204/298.16 |
| 4,950,956 | 8/1990 | Asamaki et al. ............ 315/111.21 |
| 5,000,113 | 3/1991 | Wang et al. ................ 156/345 X |
| 5,013,401 | 5/1991 | Samukawa et al. ........... 156/643 |
| 5,038,013 | 8/1991 | Akazawa et al. ............ 156/646 X |
| 5,045,166 | 9/1991 | Bobbio .................... 156/345 X |
| 5,215,619 | 6/1993 | Cheng et al. ............... 156/345 |

Primary Examiner—Thi Dang
Attorney, Agent, or Firm—Hill, Steadman & Simpson

[57] ABSTRACT

A plasma treatment method and system allowing the plasma intensity to be controllably distributed perpendicularly to the inner wall and ensuring effective and uniform treatment in the case of executing plasma cleaning, plasma CVD, RIE or the like. In the plasma treatment where plasma is generated within a chamber 1 for plasma treatment, magnetic field 31 is applied perpendicularly to the inner wall of the chamber to produce plasma whose intensity is directed perpendicularly to the inner wall of the chamber or in parallel with the surface to be treated. Further, the magnetic filed 31 rendered into a revolving field 32 may be applied to rotate the plasma to accomplish a uniform and effective treatment.

5 Claims, 11 Drawing Sheets

→ : ELECTRIC FIELD
---▶ : DC MAGNETIC FIELD

---▶ : DC MAGNETIC FIELD

- - -▶ : REVOLVING FIELD

METHOD AND SYSTEM FOR PLASMA TREATMENT

BACKGROUND OF THE INVENTION

1. Field of the Invention

The present invention relates to a plasma treatment method and a plasma treatment system, which are applicable, for example, to plasma treatments including plasma RIE (reactive sputter etching), plasma ECR (electron cyclotron resonance), plasma CVD (chemical vapor deposition) and plasma sputtering, or to a case of subjecting a vacuum evaporation system or other means to plasma cleaning, or to a case of planarizing or polishing the surface to be treated of a workpiece by use of plasma.

2. Description of the Related Arts

Although a great variety of plasma treatment techniques have been hitherto proposed, they often involve problems to be further improved which may be caused in, for example, cleaning a plasma treatment system.

For the plasma treatment, there must be cleaned the treatment system, in particular, the inner wall thereof. The cleaning is effected by use of plasma cleaning. The plasma cleaning which is referred to in this specification comprises the steps of introducing reaction gas within a chamber to be cleaned, activating the gas through, for example, ionization by plasma, and to gasify a residue product for removal. Such plasma cleaning may be applied not only to the chamber in which the plasma treatment has been carried out, but also to a case in which the chamber treatment has been effected without using plasma. The plasma treatment in the present invention means any treatment using plasma including cleaning irrespective of a manner to be used.

Conventionally, it has been already put into practical use to subject the interior of the treatment chamber in, for example, various plasma treatment systems to plasma cleaning. In the prior art, however, plasma is not allowed to reach throughout the interior of the chamber, and hence the residue product is not to be fully gasified for removal. For this reason, the system must actually undergo periodical maintenance including disassembly and cleaning. The periodical maintenance will take as much as 24 hours per one system. It is desirable to avoid, if possible, the disassembling cleaning also in view of dust removal and adsorption of water into the chamber. Thus, this is a matter to be improved.

For the prior art, more specifically, in order to clean the dust such as reaction product or polymeric product adhering onto the wall surface of, for example, a plasma CVD system, each workpiece (if semiconductor wafers are to be treated, each of the wafers) must be subjected to $O_2$ plasma ashing which comprises the plasma cleaning (if necessary, with application of magnetic field), and further the system must be disassembled for cleaning once per about two weeks, since the exclusive employment of the plasma cleaning will result in an insufficient contact of plasma with the inner wall of the chamber and uneven contact of plasma with the surface of the jig so that there remains product or polymer on the area which has not been subjected to the plasma. The stabilization of plasma discharge is not expected to encourage the prior art to achieve an adequate cleaning. After all, required is the disassembling cleaning which will take as much as 18 to 24 hours for the disassembly, cleaning, reassembly, system rise. There may also arise a design limitation that the system components must be configured to be suitable for disassembling cleaning.

In the case of the conventional plasma RIE system, polymer product, suscepter and chamber metallic compound is rendered into dust which undergoes $O_2$ plasma ashing of the order of once per five days. Due to insufficient plasma irradiation, likewise, there remains product or polymer in the area which has not been subjected to plasma which inevitably needs a disassembly cleaning in the order of once a month. This disassembly cleaning also takes as much as about 18 to 24 hours.

To ensure effective plasma cleaning, there is a proposal using cusp field shown in FIG. 2 as magnetic field method, instead of longitudinal field shown in FIG. 1 (Japanese Patent Laid-open Publication No. 91238/1991). This is assumed to accomplish effective removal of dust within a treatment chamber B by the provision of a means of axially displacing a position forming cusp filed A. Although it is considered in this technique that a variation in current passing through upper and lower coils enables the cusp field to be positionally controlled to a degree, the magnetic flux is partially orthogonal to the inner wall of the chamber, and ions and electrons contained within the plasma are allowed to come into limited contact with the inner wall of the chamber. Consequently, a sufficient cleaning effect is restrictively imparted onto only the central portion as indicated by C in FIG. 2 to prevent the entirety of the inner wall surface from being uniformly cleaned. In FIGS. 1 and 2, D represents a coil, arrows indicated by solid line represent an electric field, and arrows indicated by broken line represent a DC magnetic field.

Other prior arts of this type include Japanese Patent Laid-open publication Nos. 253617/1988, 137618/1992 and 137619/1992 which are not intended to solve the above problems.

In various plasma treatments as well as the plasma cleaning described above, the conventional plasma treatment system presents such inconveniences that the workpiece is liable to partially undergo an uneven treatment and that the maintenance of the system is difficult to perform and that the treatment is not easy to control (or that treatment capacity is difficult to change).

Referring next to FIGS. 3 to 5, there is shown a proposal rendering the longitudinal magnetic field method (refer to FIG. 1) into cusp magnetic field (refer to FIG. 2) and a mirror magnetic field.

Disadvantageously, both the cusp magnetic field method and mirror magnetic field method, and the combination thereof cause the magnetic flux to be distributed in the direction orthogonal to the surface to be treated of a workpiece such as a wafer, so that the magnetic flux is diagonally directed to the peripheral portion (or circumferential portion) to cause a poor coverage in the central portion and the peripheral portion (or circumferential portion).

This results in a difficulty of ensuring a uniformity of the magnetic flux density in the central and peripheral (or circumferential) portions. Thus, it is extremely difficult to confer a uniform plasma treatment onto the workpiece.

On the contrary, as a technique for uniformly treating a substrate to be treated with plasma, there is proposed a technique in which a plurality of permanent magnets are so provided to rotate around a plasma reaction part or a plasma generating part (Refer to Japanese Patent Laid-open Publication Nos. 244614/1988 and 244615/1988).

In this technique, however, the intensity of plasma is basically distributed orthogonally to a surface to be treated, and is not intended to be positively paralleled to the surface. Furthermore, the mechanical rotation of the permanent magnets causes an inconvenience in maintenance, and fixes the magnetic flux density, which prevents the parameters from being changed to make the control difficult. It is thus impossible to try to control, for example, a plasma treatment capacity through the variation in the magnetic flux density.

SUMMARY OF THE INVENTION

It is therefore the object of the present invention to solve the above problems involved in the prior art techniques to provide a method and system for plasma treatment capable of controlling the distribution of plasma with ease and conferring a uniform plasma treatment onto a workpiece, thereby making it possible to, in plasma cleaning for example, realize effective removal of dust to eliminate or reduce the necessity of resolvent cleaning as well as to, in plasma planarization or polishing for example, realize a uniform treatment under easy control.

In order to accomplish the above objects, a first aspect of the present invention provides a method of plasma treatment in which a plasma is generated within a treatment chamber to perform a plasma treatment, comprising the step of applying a magnetic field substantially orthogonal to the inner surface of the treatment chamber to thereby produce a plasma whose intensity is distributed in the direction substantially orthogonal to the inner surface of the treatment chamber.

According to a second aspect of the present invention, there is provided a method of plasma treatment in which a plasma is generated within a treatment chamber to perform a plasma treatment, comprising the step of applying a magnetic field substantially orthogonal to the inner surface of the treatment chamber and rotating along the inner surface of the treatment chamber to thereby produce a plasma whose intensity is distributed in the direction substantially orthogonal to the inner surface of the treatment chamber and which is rotated along the inner surface of the treatment chamber.

Preferably, the magnetic field substantially orthogonal to the inner surface of the treatment chamber is generated by a plurality of coils arranged circumferentially along the periphery of the treatment chamber.

The magnetic field is preferably rendered a revolving field by a plurality of coils arranged circumferentially along the periphery of the treatment chamber.

Preferably, an alternating current is applied to the plurality of coils to produce a revolving field.

The plasma is preferably used for a chamber cleaning.

According to a third aspect of the present invention, there is provided a method of plasma treatment in which a plasma is generated within a treatment chamber to execute a plasma treatment, comprising the step of applying a magnetic field produced by an electrode coil so that the plasma intensity is distributed in substantially parallel to a surface to be treated of a workpiece.

Preferably, the plasma whose intensity is distributed in substantially parallel to the surface to be treated of the workpiece is allowed to rotate within a plane substantially parallel to the surface to be treated of the workpiece.

Preferably, the plasma whose intensity is distributed in substantially parallel to the surface to be treated of the workpiece is controlled by a magnetic field applied by a plurality of electromagnetic coils arranged circumferentially along the periphery of the treatment chamber.

The magnetic field is preferably rendered a revolving field by a plurality of electromagnetic coils arranged circumferentially along the periphery of the treatment chamber.

Preferably, an alternating current is applied into the plurality of electromagnetic coils to produce a revolving field.

The plasma may be used for plasma chemical vapor deposition, or plasma reactive ion etching.

The plasma may also be used to planarize or polish the workpiece.

In order to accomplish the above objects, a fourth aspect of the present invention provides a plasma treatment system including a treatment chamber in which a plasma is generated for plasma treatment, comprising a means of applying a magnetic field substantially normal to the inner surface of the treatment chamber to thereby distribute the plasma intensity in a direction substantially normal to the inner surface of the treatment chamber.

According to a fifth aspect of the present invention, there is provided a plasma treatment system including a treatment chamber in which a plasma is generated for plasma treatment, comprising a means for applying a revolving magnetic field along the inner surface of the treatment chamber, the revolving magnetic field producing a revolving plasma in contact with the inner surface of the treatment chamber and circumferentially along the periphery of the treatment chamber.

Preferably, the magnetic field application means comprises a plurality of coils arranged circumferentially along the outer wall surface of the treatment chamber.

Preferably, an alternating current is applied into the plurality of coils serving as the magnetic field application means to produce a revolving field.

Preferably, the plasma treatment system further comprises a control means for controlling the frequency of the alternating current for the supply to the coils.

Preferably, the plasma treatment system further comprises a cooling means for cooling the treatment chamber.

Preferably, the cooling means is a heat exchanger intended to cool the outer wall of the treatment chamber.

The inner surface of the treatment chamber is preferably provided with a anti-plasma coating.

The plasma treatment system can be a plasma cleaning system, or a plasma chemical vapor deposition system, or a reactive ion etching system.

The plasma treatment system can be a system using plasma for planarizing or polishing the workpiece.

The term "plasma treatment" used in the present invention includes not only the case using plasma for major treatments but also the case using the plasma for auxiliary treatments (e.g., cleaning).

In the present invention, the revolving field is preferably formed by, for example, an alternating current (whose frequency is preferably under optimal control) through a plurality of coils.

For the application of the present invention to a plasma cleaning means, preferably, an alternating current is supplied to electromagnetic coils arranged on the outside of the treatment chamber so as to produce a revolving field along the inner wall of the chamber, thereby rotationally expanding plasma throughout the interior of the chamber to gasify the residue product adhering to the inner wall and other part for perfect removal.

The inner wall of the treatment chamber is preferably coated with a material such as Teflon having a high plasma resistance. In addition, a cooling means such as cooling piping is preferably provided on the outer wall.

Gas for use in the plasma cleaning is preferably a non-depositional gas, for example, a halogen series gas such as preferably $NF_3$, $SF_6$ and $ClF_3$. Gas for plasma ashing preferably comprises $O_2$ or $O_3$ which is an oxidizing gas.

In the present invention, the supply of an alternating current, for example, is effected at the time of plasma treatment (including plasma CVD and RIE) so as to produce a revolving magnetic field running and preferably rotating parallel with the surface of a workpiece such as a wafer so that ions reaching the surface of the workpiece are directed parallel with the surface of the workpiece and are allowed to uniformly strike on the surface of the workpiece. This results in, for example, a uniform and satisfactory planarization (CVD) of deposition onto the surface to be treated and polishing (RIE) of uneven surface of the workpiece. These apply to not only the Si process but also all processes which require planarization and polishing.

The operation of the present invention will now be described with reference to FIGS. 6 and 7 schematically depicting the constitution of the invention.

A plasma treatment system having a chamber in which plasma is generated for plasma treatment in accordance with the present invention, as shown in FIG. 6, comprises a plurality of coils 2 serving as magnetic field generating means and arranged along the periphery of the chamber so as to generate a magnetic field directed perpendicularly to the inner wall surface of the chamber as designated by 31 to thereby produce a plasma whose intensity is distributed perpendicularly to the inner wall surface or parallel with the surface to be treated. In the shown example, the magnetic field 31 is caused to become a revolving field indicated by an arrow 32 along the periphery of the inner wall surface with the aid of alternating current under control, to thereby produce a revolving plasma being in contact with the inner wall surface of the chamber 1 and running along the periphery of the chamber 1.

As a result, the magnetic flux always extends orthogonally to the inner wall of the treatment chamber 1 to allow the intensity of plasma to be distributed orthogonally to the inner wall. Further, the revolution of the magnetic field allows ions or electrons to come into uniform contact with the inner wall surface of the chamber. Thus, there can be obtained a plasma whose intensity is uniformly controlled with respect to the treatment chamber. This is applicable to, for example, plasma cleaning to realize effective and even removal of dust, or may be applied to other plasma treatment including planarization or polish to accomplish a uniform plasma treatment.

In FIGS. 6 and 7, the plurality of coils 2 are supported by a frame 20. Reference numeral 4 denotes a workpiece or material to be treated such as a wafer. By means of an inverter power source designated at 5, the coils 2 are supplied with alternating current having a properly controlled frequency.

A multi-phase alternating current such as three-phase alternating current, by way of example, may be used to present the revolving field.

The employment of the present invention enables the magnetic flux density and the rotational speed of magnetic field to be separately adjusted due to the option of the magnetic field to be applied for the control of plasma distribution. This will facilitate the setting of optimal magnetic field and rotational speed in conformity with ion species used. Moreover, the absence of the drive unit eliminates the necessity of maintenance as well as difficulty associated therewith.

Furthermore, the intensity of plasma is directed perpendicularly to the inner wall surface of the chamber so as to be distributed parallel with the surface to be treated of the workpiece, instead of being directed along the inner wall surface of the chamber (in general, orthogonally to the surface of the workpiece). Accordingly, there can be eliminated non-uniformity in magnetic field at the center and peripheral portion (or circumferential portion) and therefore non-uniformity in treatment which may be caused in cusp field or mirror field, to thereby realizing in-process various uniform treatments including planarization and polishing, which leads to the reduction in number of processes.

BRIEF DESCRIPTION OF THE DRAWINGS

These and other objects and advantages of the present invention will become more apparent from the following detailed description when viewed in conjunction with the accompanying drawings, in which.

DESCRIPTION OF THE PREFERRED EMBODIMENTS

Preferred embodiments of the present invention will now be described with reference to the accompanying drawings. Naturally, the present invention is not intended to be restricted by these embodiments.

Embodiment 1

A first embodiment in which the present invention is applied to a case of using a plasma chemical vapor deposition (CVD) system having parallel plate electrodes employs a revolving magnetic field in carrying out a plasma cleaning or chamber cleaning.

Figure 8:
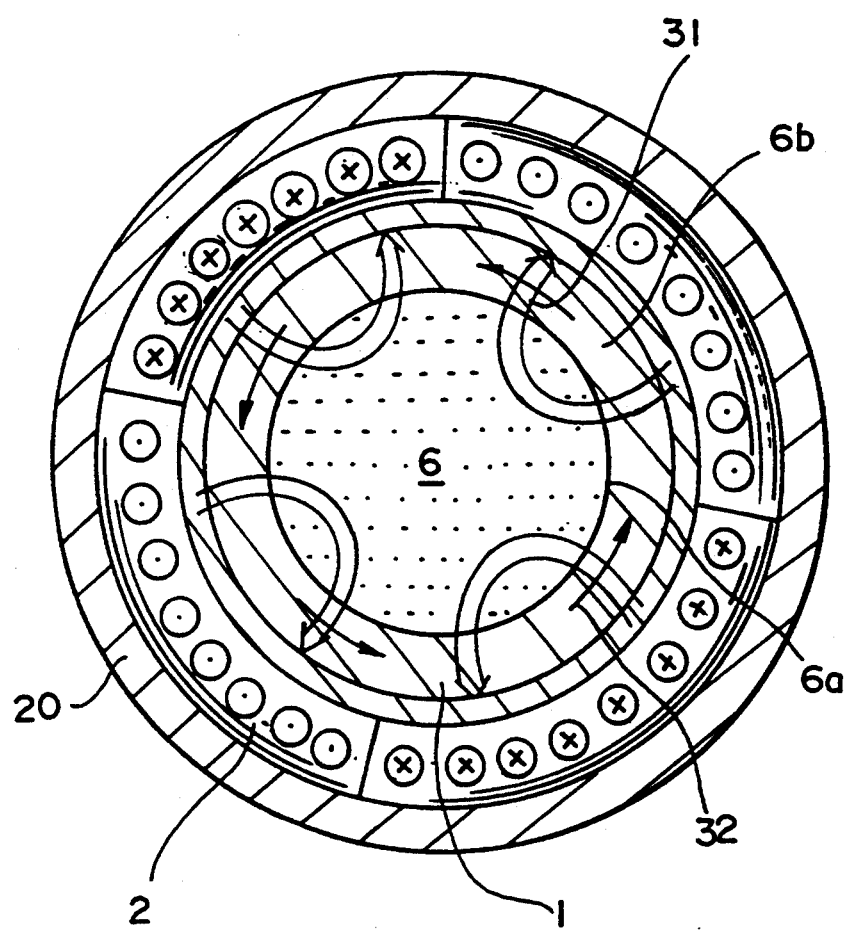
FIG. 8 depicts in transverse cross section a construction of a first embodiment in accordance with the present invention.
Figure 9:
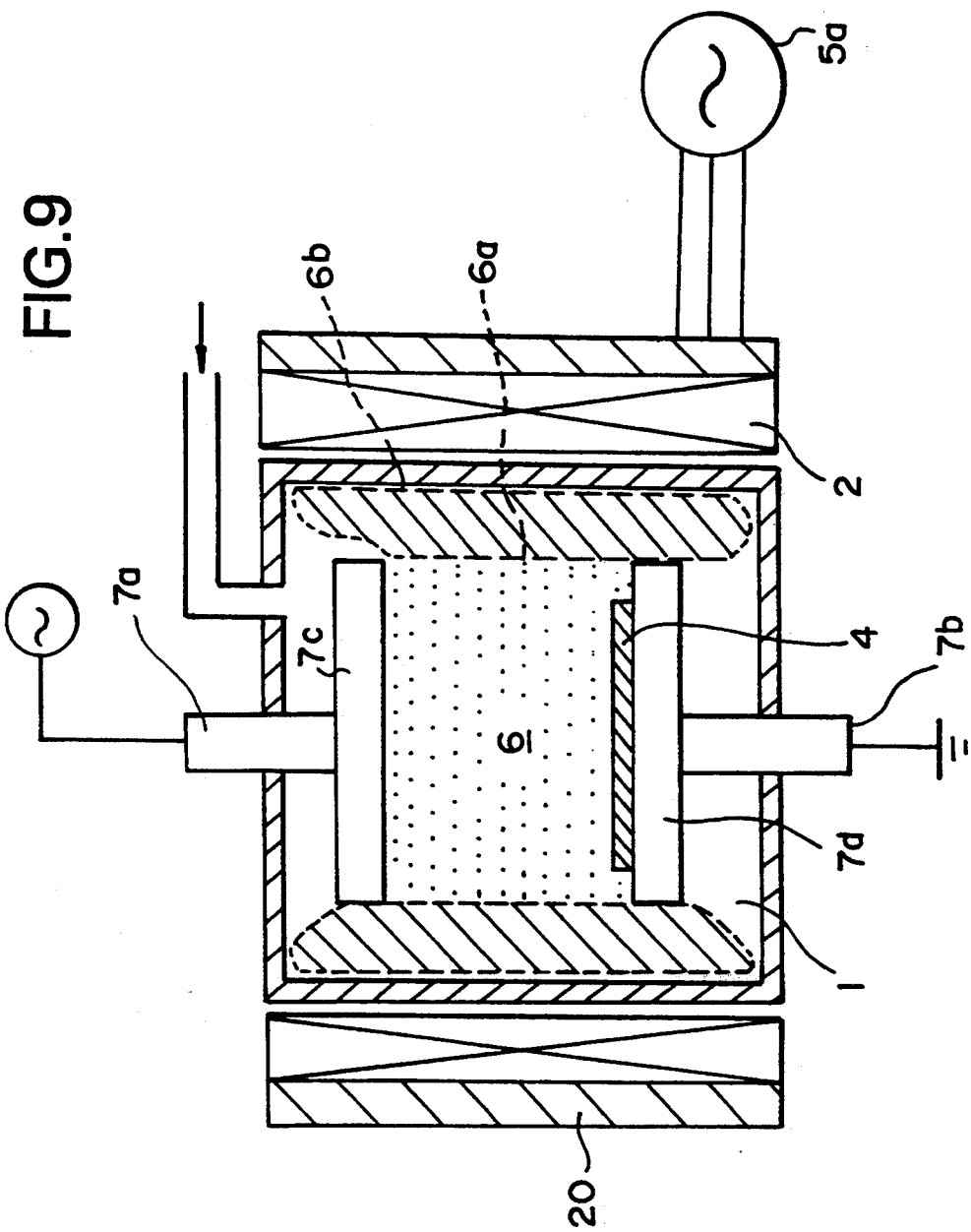
FIG. 9 depicts in vertical cross section the construction of the first embodiment.

Referring first to FIG. 8 and 9, there are shown a plurality of electromagnetic coils 2 arranged along the periphery of the outer wall of a cylindrical treatment chamber 1 so as to apply a magnetic field 31 directed toward the inner wall surface of the chamber 1 so that plasma is allowed to be distributed in the direction orthogonal to the inner wall surface of the chamber 1. Each of the electromagnetic coils is formed of a longitudinal winding, that is, a winding extending in the direction normal to the surface of FIG. 8.

Plasma 6 is produced between parallel plate electrodes 7a and 7b, and in the absence of the magnetic field 31 is allowed to be distributed only between parallel plate electrodes 7c and 7d as indicated by dotted area in FIGS. 8 and 9 (which is designated at reference numeral 6a). The distribution of the plasma 6 existing only between the parallel plate electrodes 7c and 7d ensures an effective processing of a workpiece 4 such as a wafer.

In the plasma cleaning, however, this may singly allow a residue product since the inner wall and other part of the chamber 1 are not subjected to the plasma (that is, etching gas ions, or radicals) though the surface and its vicinity of the electrodes 7c and 7d are cleaned.

In this embodiment, on the contrary, alternating current (or three-phase alternating current in this case) is supplied into the electromagnetic coils arranged on the outer periphery of the treatment chamber 1 so as to produce the magnetic field 31 directed orthogonally to the inner wall of the chamber 1. Plasma ions or electrons are allowed to easily reach the inner surface of the chamber 1 while rotationally moving around magnetic lines of force, thereby gasifying the residue product for its removal. In other words, by virtue of the magnetic field 31, the plasma 6 is expanded diametrically or in the direction perpendicular to the inner wall, and comes into contact with the inner wall, as indicated by 6b, particularly, with hatching in FIGS. 8 and 9, to perform effective cleaning.

Since the magnetic field 31 is forced to slowly rotate along the inner periphery of the chamber by the alternating current whose frequency is properly controlled by an inverter in this embodiment, the plasma fully expands into the space within the treatment chamber 1 while being in uniform contact with the inner wall.

The above action ensures that the plasma spreads through the entirety of the treatment chamber 1 for perfect plasma cleaning.

In this embodiment, the plasma cleaning was carried out by NF$_3$ or through plasma ashing using O$_2$ to obtain satisfactory results.

The inner wall of the treatment chamber 1 in this embodiment was Teflon-coated to retain a plasma resistance.

Piping was also arranged on the outer wall to lead a coolant so as to perform a cooling through heat exchange.

To secure a plasma stability, in this embodiment, the rotational speed of the magnetic field was set to be relatively low. More specifically, twelve (12) poles of coils 2 were provided to obtain a rotational magnetic field of 20 rpm at 2 Hertz. Thus, there appeared a smooth rotational field. Coil winding can employ proper winding techniques such as wave winding and lap winding to form a longitudinal winding solenoid.

Figure 1:
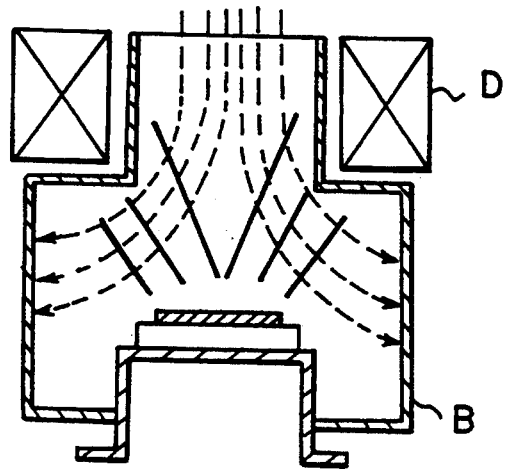
FIG. 1 is a diagram showing a prior art.
Figure 2:
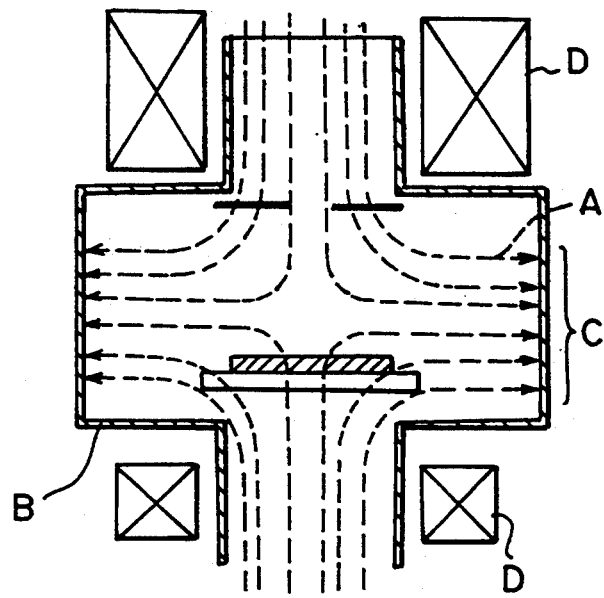
FIG. 2 is a diagram showing another prior art.
Figure 5:
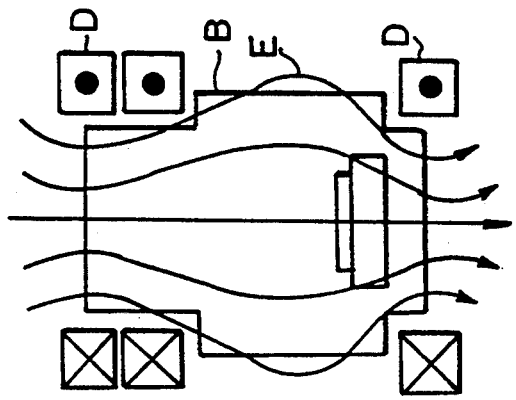
FIGS. 3 to 5 are diagrams showing problems involved in the prior arts.
Figure 4:
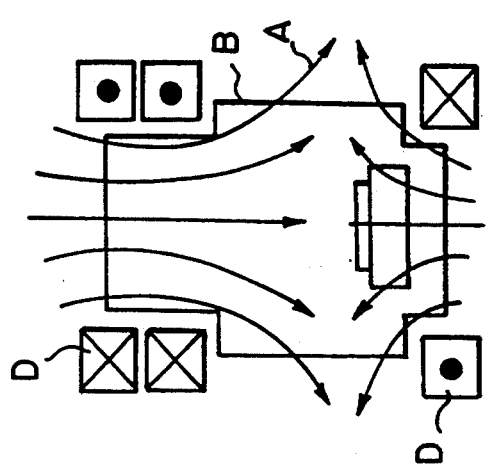
Figure 3:
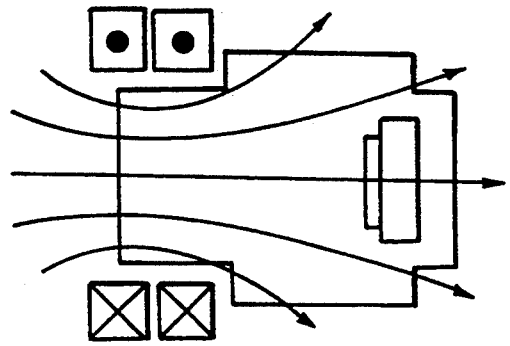
Figure 6:
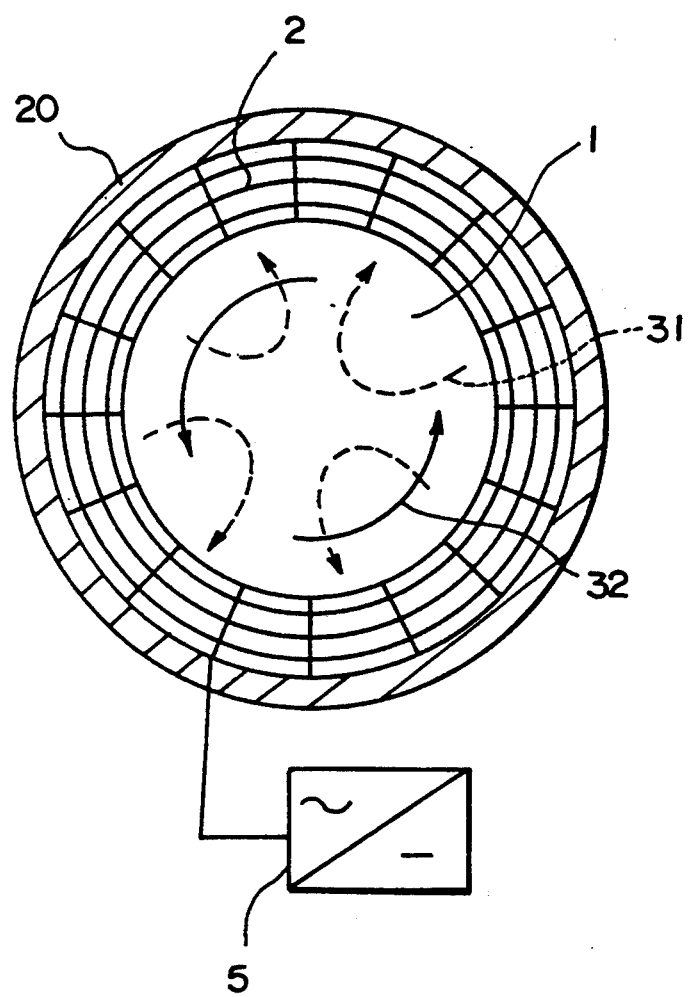
FIG. 6 is a transverse sectional view of a constitutional example of the present invention.
Figure 7:
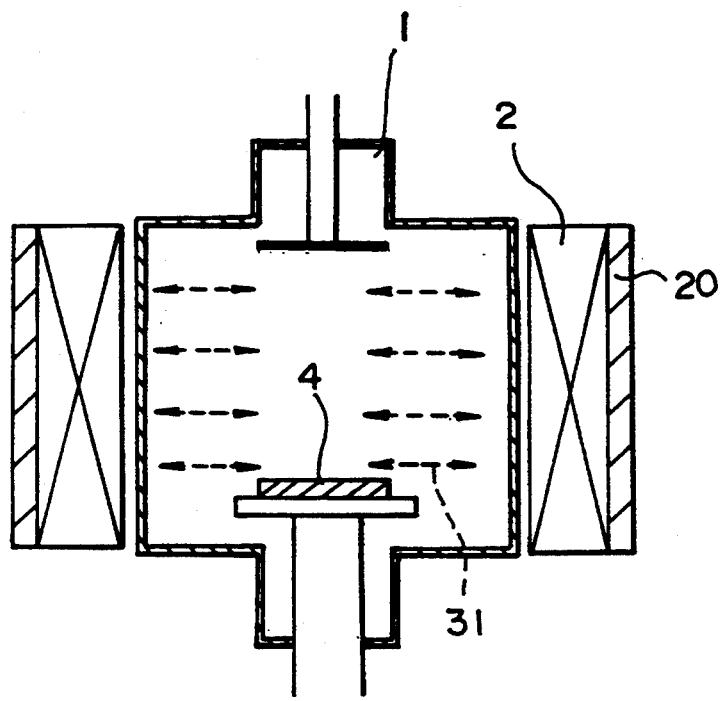
FIG. 7 is a vertical sectional view of the constitutional example of the present invention.

This construction ensures a uniform longitudinal magnetic field (in the vertical direction in FIG. 9) to prevent the magnetic field from being locally distributed as shown in FIGS. 1 and 2.

Figure 10:
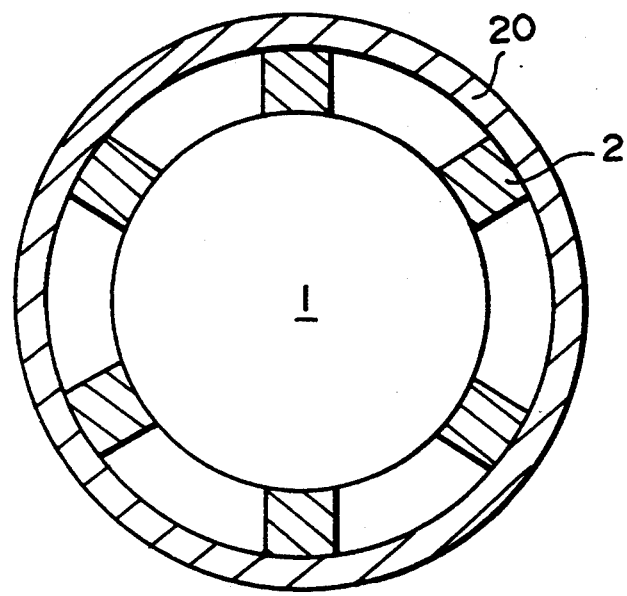
FIG. 10 depicts a variant of the first embodiment.
Figure 11:
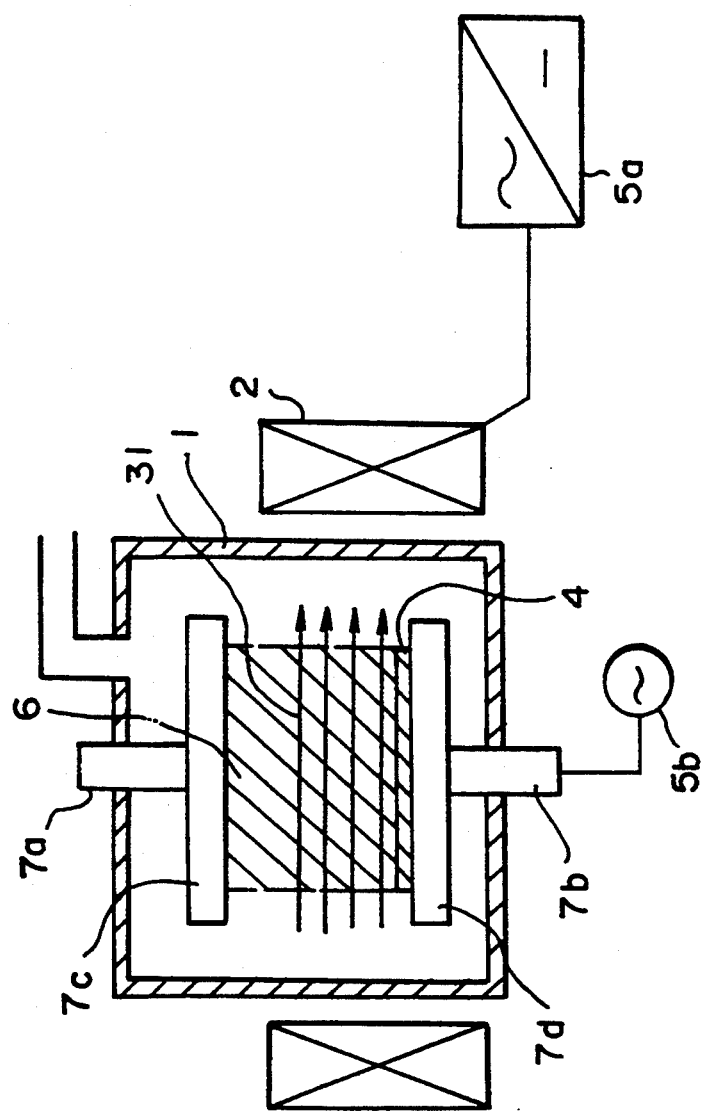
FIG. 11 depicts a construction of a second embodiment in accordance with the present invention.

The coils may be partially arranged as shown in FIG. 10, in stead of extending along the entire circumference.

Embodiment 2

In a second embodiment, the present invention was executed in a manner subjecting the surface of a semiconductor wafer to plasma CVD for planarization.

Referring to FIG. 9, description will be given of a case of parallel plate electrodes. The same operating principle applies to bias ECR (electron cyclotron resonance) plasma CVD and reactive ion etching (RIE).

In the second embodiment, plasma 6 is generated between upper and lower electrodes designated by 7a and 7b, respectively, and is, more specifically, distributed between planar electrodes 7c and 7d.

Due to the provision of an electromagnetic coil 2 supplied with three-phase alternating current, magnetic field is applied parallel with a surface to be treated of a workpiece 4 (or wafer) while rotating parallel with the surface to be treated.

This allows the plasma 6 to be distributed parallel with the surface to be treated and to be rotated parallel with the surface to present a uniform distribution as a whole.

Figure 12:
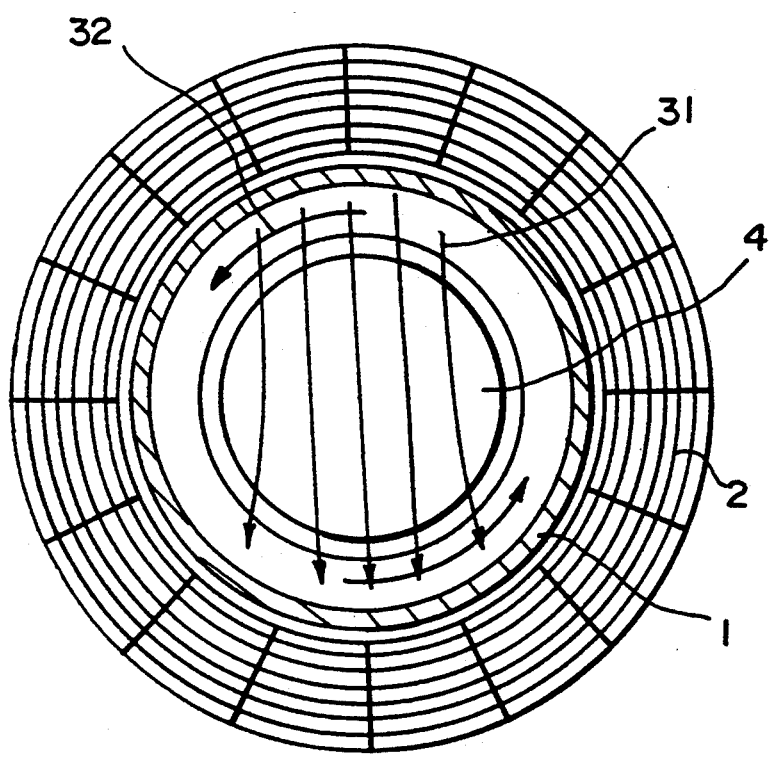
FIG. 12 is a diagram showing a revolving field in the second embodiment.

Referring next to FIG. 12, there is shown a magnetic flux 31 and its rotational direction 32 in bipolar type treatment system.

Figure 13:
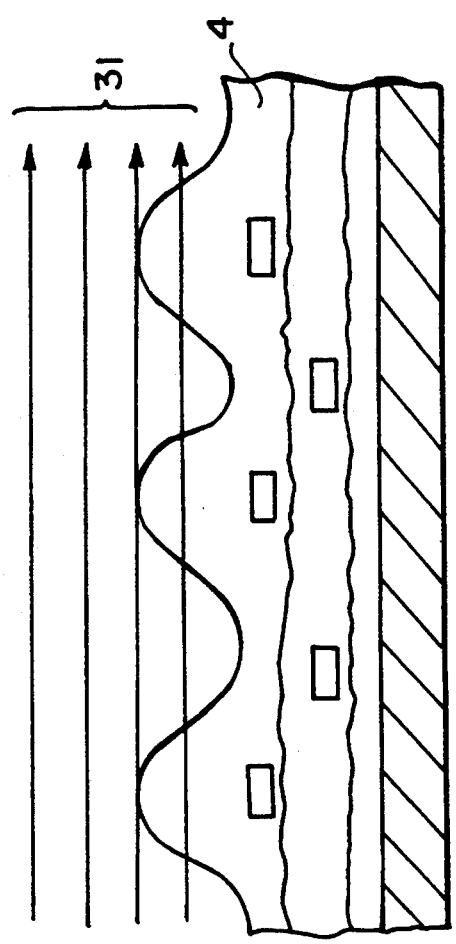
FIG. 13 is a diagram for explaining a function of the second embodiment.

When such treatment system is used to perform a chemical vapor deposition for planarization as shown in FIG. 13, the magnetic flux 31 runs parallel with a surface to be treated (the area subjected to CVD or etching) of the workpiece as diagrammatically indicated by arrows so that a uniform treatment can be imparted to an uneven surface to be treated.

Although the electromagnetic coil is formed of longitudinal winding in this embodiment, it may be fashioned into so-called lap winding or wave winding.

Furthermore, this embodiment employed a high field of 7100 gauss at maximum to produce a high density plasma.

Embodiment 3

Figure 14:
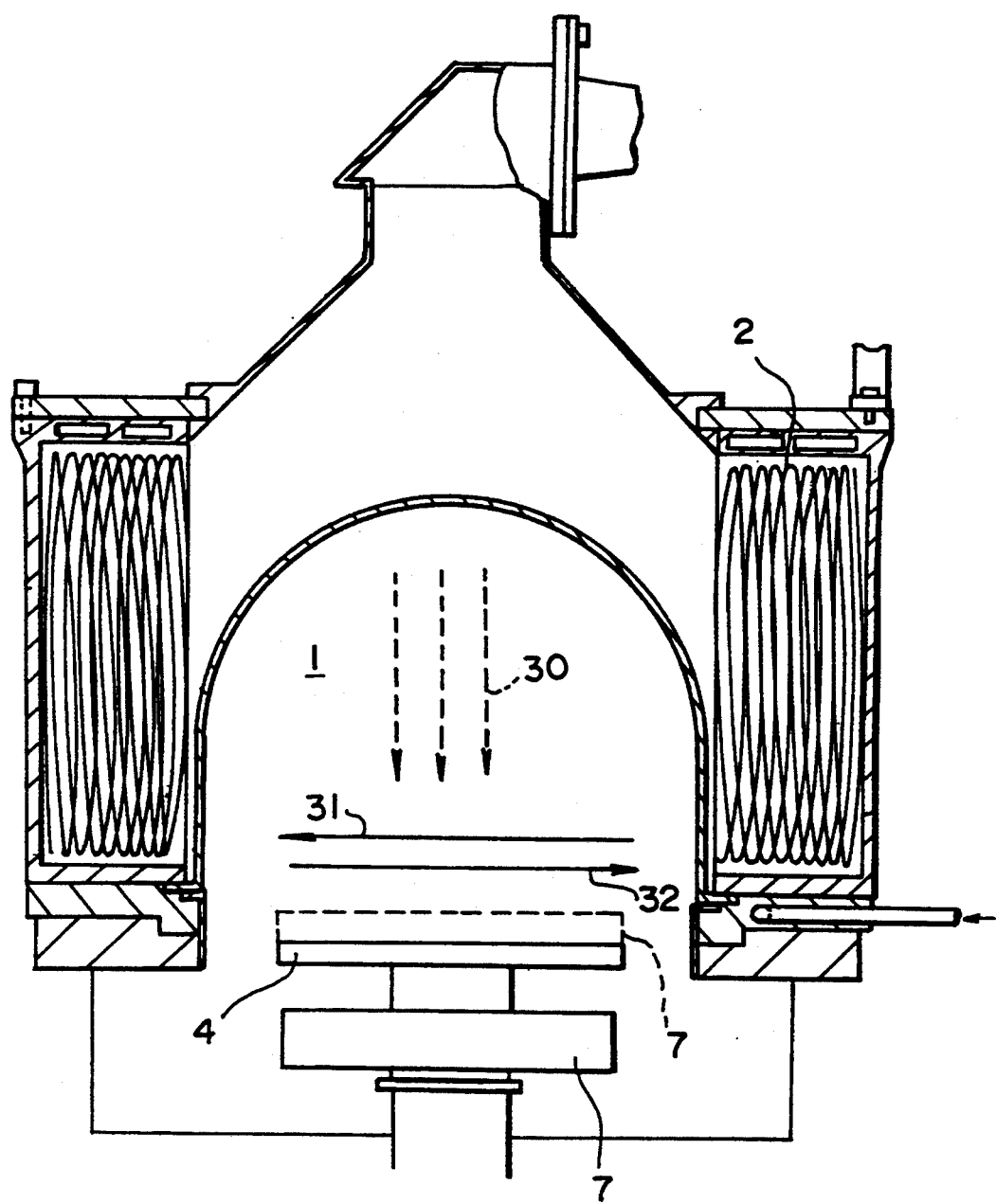
FIG. 14 depicts a third embodiment constructed in accordance with the present invention.

Referring finally to FIG. 14, there will be described a third embodiment applying the present invention to a case where grooves are filled by use of a bias ECR-plasma CVD method which is a deposition technique simultaneously executing etching and deposition, and then are planarized by polishing through the etching.

This embodiment employed a magnetic flux of 875G at 2.45 GHz. The conditions for the bias ECR-CVD in filling for planarization were as follows:

Gas series used: SiH$_4$/N$_2$O=20/35 SCCM
Pressure: 7×10$^{-4}$ Torr
Microwave: 800 W
RF bias: 500 W This realized a satisfactory filling for planarization. As is apparent from FIG. 14, the magnetic flux is applied parallel with a surface to be treated of a workpiece 4 (or semiconductor wafer) as designated by 31 with respect to the conventional flow of plasma perpendicular to the surface to be treated as designated by 30, thereby controlling the flow of plasma so as to uniformly act on the surface to be treated.

In the diagram, reference numeral 7e can be a hollow cathode, while 7 is a cathode.

As diagrammatically shown, the electromagnetic coil 2 is formed of longitudinal winding.

According to the present invention, a uniform plasma treatment can be imparted on the workpiece while controlling the distribution of plasma with ease. Thus, for example, a plasma cleaning ensures effective removal of dust. Likewise, there can be uniformly and controllably realized a plasma treatment for planarization or polish.

While an illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A self-cleaning plasma treatment system for performing plasma operations including plasma cleaning, plasma chemical vapor deposition, reactive ion etching, plasma planarization, plasma polishing, said system comprising:

a substantially elongated cylindrical treatment chamber having a peripheral sidewall and having a length dimension, a plurality of coils arranged outwardly circumferentially along the peripheral sidewall of said treatment chamber having a length dimension substantially equal to the length dimension of the treatment chamber, and effective on application of alternating current to define a rotating magnetic field in the treatment chamber directed substantially orthogonal to the sidewall of the treatment chamber over the length thereof, a pair of parallel spaced plate electrodes disposed in the treatment chamber for generating plasma therebetween, the parallel plate electrodes being spaced apart by a distance less than the length of the treatment chamber and less than the length of the coils, means for introducing non-depositional plasma-forming gas into the treatment chamber, means for defining a plasma generating electrical field between the plate electrodes and means for applying alternating current to the coils, whereby a plasma treatment may be provided wherein the intensity of the plasma generated is distributed substantially parallel to a workpiece placed between the spaced plate electrodes and substantially normal to an inner surface of the peripheral sidewall over substantially the total length thereof to provide a self-cleaning plasma treatment system.

2. A plasma treatment system according to claim 1, further comprising control means for controlling the frequency of alternating current being supplied to said coils.

3. A plasma treatment system according to claim 1, further comprising cooling means for cooling the peripheral sidewall of the treatment chamber.

4. A plasma treatment system according to claim 3, wherein said cooling means is a heat exchanger intended to cool an outer surface of the peripheral sidewall of said treatment chamber.

5. A plasma treatment system according to claim 1, wherein said inner surface of said treatment chamber is provided with a plasma resistant coating.

* * * * *